US012320778B2

(12) United States Patent
Yoshino et al.

(10) Patent No.: US 12,320,778 B2
(45) Date of Patent: *Jun. 3, 2025

(54) METHOD OF PROCESSING SUBSTRATE, SUBSTRATE PROCESSING APPARATUS, METHOD OF MANUFACTURING SEMICONDUCTOR PROCESSING APPARATUS, AND RECORDING MEDIUM

(71) Applicant: Kokusai Electric Corporation, Tokyo (JP)

(72) Inventors: Teruo Yoshino, Toyama (JP); Naofumi Ohashi, Toyama (JP); Toshiro Koshimaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/499,589

(22) Filed: Nov. 1, 2023

(65) Prior Publication Data
US 2024/0142409 A1 May 2, 2024

Related U.S. Application Data

(63) Continuation of application No. 17/682,436, filed on Feb. 28, 2022, now Pat. No. 11,841,343.

(30) Foreign Application Priority Data

Sep. 17, 2021 (JP) .................................. 2021-152122

(51) Int. Cl.
*G01N 29/14* (2006.01)
*C23C 16/458* (2006.01)
(Continued)

(52) U.S. Cl.
CPC ......... *G01N 29/14* (2013.01); *C23C 16/4583* (2013.01); *G01M 99/005* (2013.01);
(Continued)

(58) Field of Classification Search
CPC . G01N 29/14; C23C 16/4583; G01M 99/005; H01L 21/67739; H01L 21/67259; H01L 21/67793; H04R 1/08
(Continued)

(56) References Cited

U.S. PATENT DOCUMENTS 3,795,137 A * 3/1974 Lo ........................... G01M 3/02
73/45.4
3,856,777 A * 12/1974 Ishido ................... C07H 19/06
536/28.54
(Continued)

FOREIGN PATENT DOCUMENTS

JP 2006-278396 A 10/2006
JP 2017-177402 A 10/2017
(Continued)

OTHER PUBLICATIONS

Korean Office Action issued on Feb. 16, 2024 for Korean Patent Application No. 10-2022-0026257.
(Continued)

*Primary Examiner* — Charlee J. C. Bennett
(74) *Attorney, Agent, or Firm* — Volpe Koenig

(57) ABSTRACT

There is provided a technique that includes abnormality detecting by picking up a sound generated from a transfer configured to operate in a vacuum and transport a substrate in a vacuum transfer chamber and compare the sound information with a preset threshold value to detect an abnormality of the transfer. The transfer includes a gas-filled
(Continued)

container arranged in the vacuum transfer chamber and filled with a gas and a microphone installed inside the gas-filled container.

16 Claims, 10 Drawing Sheets

(51) Int. Cl.
  *G01M 99/00* (2011.01)
  *H01L 21/67* (2006.01)
  *H01L 21/677* (2006.01)
  *H04R 1/08* (2006.01)

(52) U.S. Cl.
  CPC ......... *H01L 21/67739* (2013.01); *H04R 1/08* (2013.01); *H01L 21/67259* (2013.01); *H01L 21/67793* (2013.01)

(58) Field of Classification Search
  USPC ....................................................... 700/121
  See application file for complete search history.

(56) References Cited

U.S. PATENT DOCUMENTS

| | | | | |
|---|---|---|---|---|
| 5,365,554 | A * | 11/1994 | Flaman | G21C 17/10 |
| | | | | 376/245 |
| 5,566,092 | A * | 10/1996 | Wang | G05B 19/4184 |
| | | | | 706/912 |
| 5,575,310 | A * | 11/1996 | Kamen | G01F 1/34 |
| | | | | 137/565.34 |
| 6,498,992 | B1 * | 12/2002 | Toyota | G01M 13/045 |
| | | | | 702/35 |
| 6,601,054 | B1 * | 7/2003 | Lo | G05B 5/01 |
| | | | | 706/14 |
| 8,356,207 | B2 | 1/2013 | Hosek | G06F 11/008 |
| | | | | 714/48 |
| 10,978,333 | B2 * | 4/2021 | Liu | H01L 21/68707 |
| 11,022,437 | B2 * | 6/2021 | Wang | H01L 21/67781 |
| 11,841,343 | B2 * | 12/2023 | Yoshino | H01L 21/67766 |
| 2004/0001750 | A1 * | 1/2004 | Kremerman | B25J 9/043 |
| | | | | 414/744.1 |
| 2005/0044966 | A1 * | 3/2005 | Gysling | G01F 1/74 |
| | | | | 73/861.26 |
| 2006/0215347 | A1 | 9/2006 | Wakabayashi | |
| 2007/0128827 | A1 * | 6/2007 | Faris | H01L 21/76254 |
| | | | | 257/E21.705 |
| 2007/0185687 | A1 * | 8/2007 | Speasl | G03F 7/7075 |
| | | | | 702/185 |
| 2007/0220903 | A1 * | 9/2007 | Watanabe | F25B 9/14 |
| | | | | 62/6 |
| 2009/0153144 | A1 * | 6/2009 | Hansen | G01R 31/00 |
| | | | | 324/511 |
| 2009/0265322 | A1 * | 10/2009 | Asai | G05B 19/4183 |
| 2011/0248190 | A1 * | 10/2011 | Tanaka | H01L 21/681 |
| | | | | 414/816 |
| 2013/0204421 | A1 * | 8/2013 | Hayashi | H01L 21/67259 |
| | | | | 700/112 |
| 2014/0169585 | A1 * | 6/2014 | Howes | H04R 1/086 |
| | | | | 381/91 |
| 2014/0273489 | A1 * | 9/2014 | Wang | H01L 21/67739 |
| | | | | 438/716 |
| 2015/0219439 | A1 * | 8/2015 | Kondoh | H01L 21/67766 |
| | | | | 356/614 |
| 2016/0370327 | A1 * | 12/2016 | Moldover | G01N 29/036 |
| 2017/0092517 | A1 * | 3/2017 | Ohashi | H01L 21/68707 |
| 2019/0019719 | A1 * | 1/2019 | Atwood | H01L 21/67201 |
| 2019/0204144 | A1 | 7/2019 | Oishi et al. | |
| 2019/0339119 | A1 * | 11/2019 | Tamatsukuri | H01L 21/677 |
| 2020/0392805 | A1 * | 12/2020 | Kamler | E21B 28/00 |
| 2021/0249297 | A1 * | 8/2021 | Chu | H01L 21/67288 |

FOREIGN PATENT DOCUMENTS

| | | |
|---|---|---|
| KR | 10-2019-0095278 A | 8/2019 |
| TW | 200634462 A | 10/2006 |
| WO | 2018/061145 A1 | 4/2018 |
| WO | 2018/110337 A1 | 6/2018 |
| WO | 2020/157967 A1 | 8/2020 |

OTHER PUBLICATIONS

Japanese Office Action issued on Feb. 7, 2023 for Japanese Patent Application No. 2021-152122.
Taiwan Office Action issued on May 30, 2023 for Taiwan Patent Application No. 111103234.

* cited by examiner

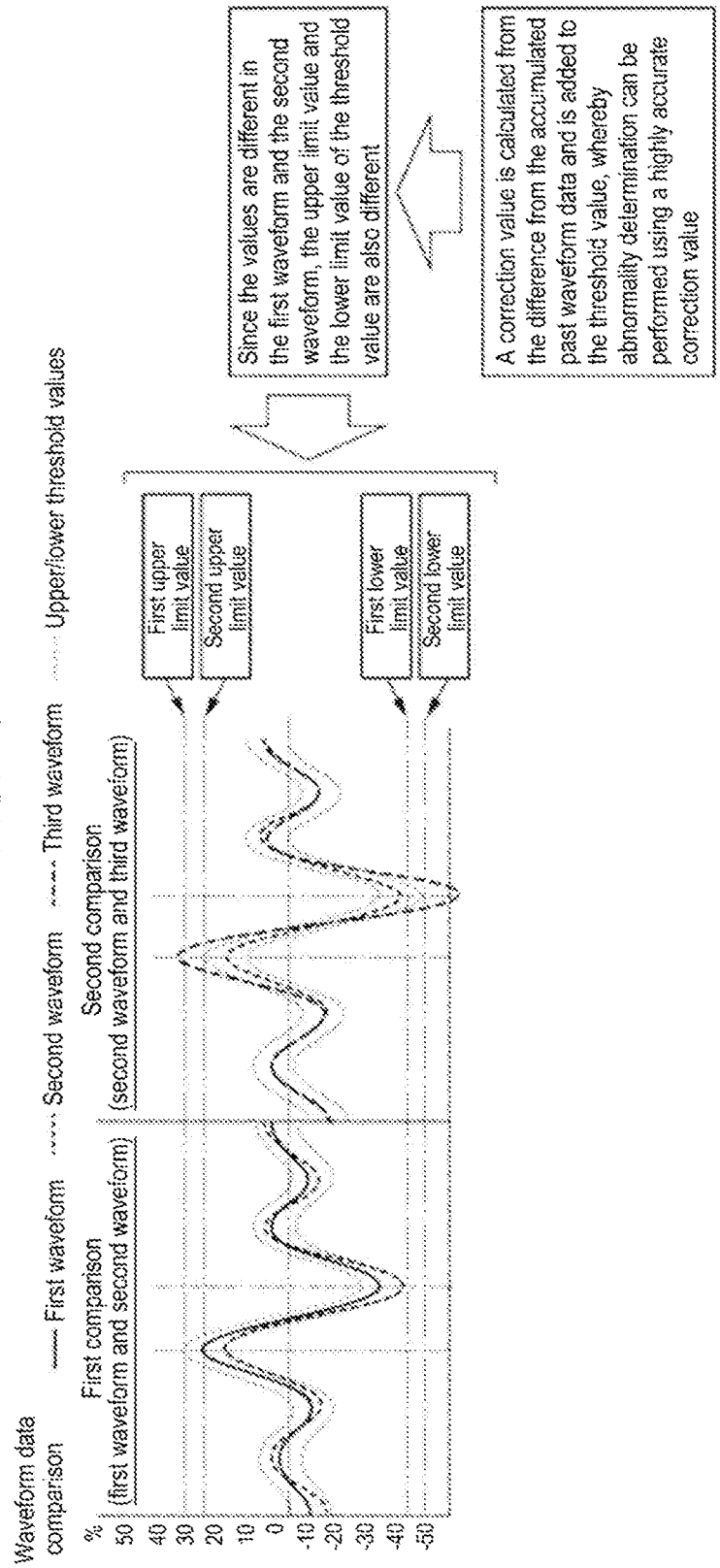

METHOD OF PROCESSING SUBSTRATE, SUBSTRATE PROCESSING APPARATUS, METHOD OF MANUFACTURING SEMICONDUCTOR PROCESSING APPARATUS, AND RECORDING MEDIUM

CROSS-REFERENCE TO RELATED APPLICATION

This application is a continuation of U.S. patent application Ser. No. 17/682,436, filed on Feb. 28, 2022, which is based upon and claims the benefit of priority from Japanese Patent Application No. 2021-152122, filed on Sep. 17, 2021, the entire contents of which are incorporated herein by reference.

TECHNICAL FIELD

The present disclosure relates to a method of processing a substrate, a substrate processing apparatus, a method of manufacturing a semiconductor processing apparatus, and a recording medium.

BACKGROUND

In the related art, there is known a substrate processing apparatus in which a vibration sensor for detecting vibration is installed in a substrate transfer mechanism. In the substrate processing apparatus of the related art, the state of the transfer mechanism, i.e., whether the transfer of a wafer is hindered, is detected by detecting the vibration of the transfer mechanism during operation with the vibration sensor.

In the substrate processing apparatus of the related art, the state of the transfer mechanism is detected. However, there is a problem in detecting an abnormality or a failure of the transfer mechanism.

SUMMARY

Some embodiments of the present disclosure provide a technique capable of detecting an abnormality or a failure of a transfer device for transferring a substrate.

According to one embodiment of the present disclosure, there is provided a technique that includes abnormality detecting by picking up a sound generated from a transfer device configured to transfer the substrate and comparing a waveform of sound data with a preset threshold value to detect an abnormality of the transfer device; and failure detecting by picking up vibration of the transfer device and comparing a waveform of vibration data with a preset threshold value to detect a failure of the transfer device.

BRIEF DESCRIPTION OF DRAWINGS

The accompanying drawings, which are incorporated in and constitute a part of the specification, illustrate embodiments of the present disclosure.

FIG. 10 is an explanatory diagram illustrating correction of a threshold value.

DETAILED DESCRIPTION

Figure 1:
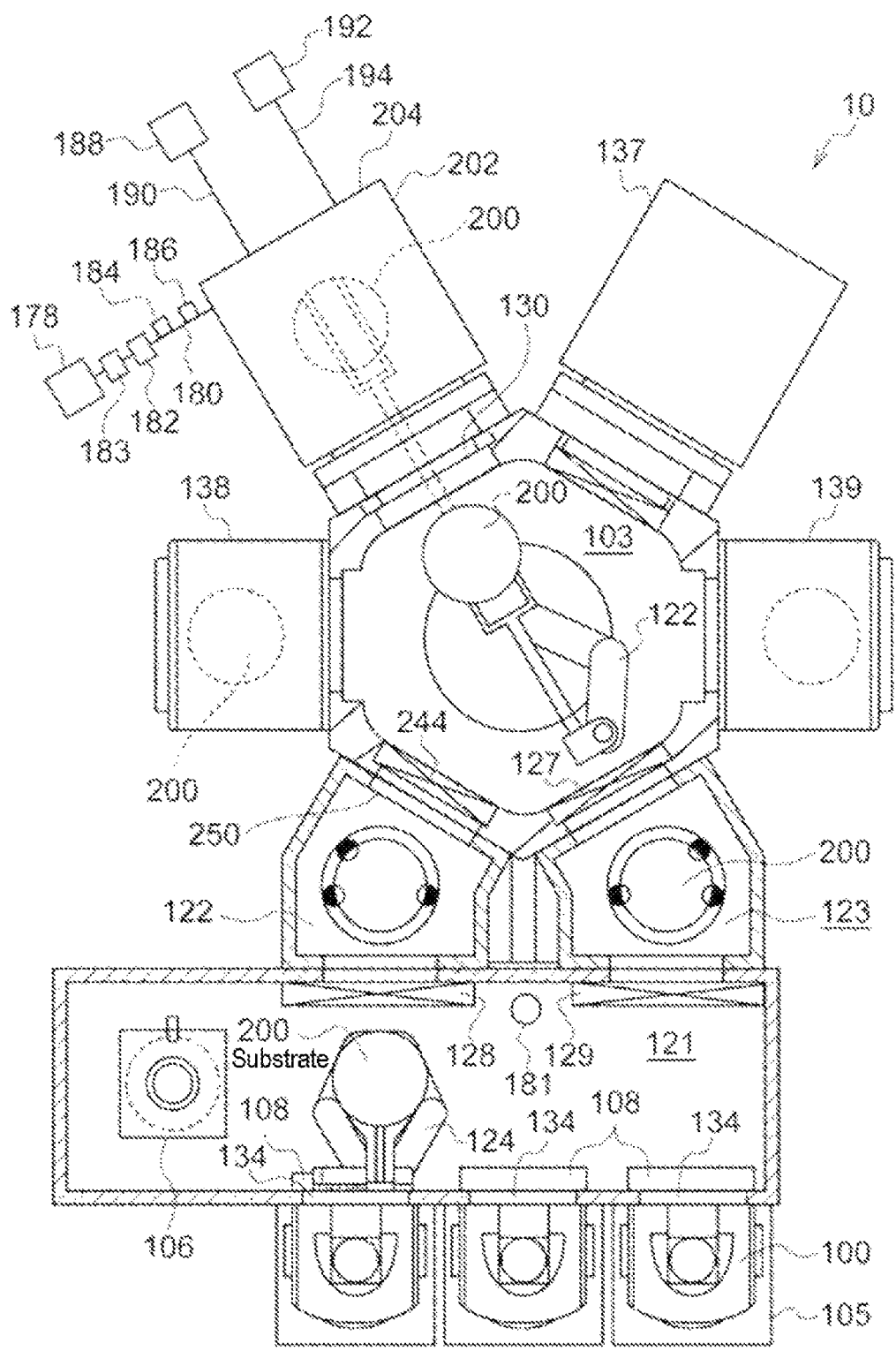
FIG. 1 is a plan view showing an outline of a substrate processing apparatus according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, the substrate processing apparatus 10 according to an embodiment of the present disclosure will be described with reference to FIGS. 1 to 6. The drawings used in the following description are all schematic. The dimensional relationship of respective elements, the ratio of respective elements, and the like shown in the drawings do not always match the actual ones. Further, even between the plurality of drawings, the dimensional relationship of respective elements, the ratio of respective elements, and the like do not always match.

(Outline of Substrate Processing Apparatus)

First, the outline of the substrate processing apparatus 10 of the present embodiment will be described with reference to FIGS. 1 and 2. The substrate processing apparatus 10 includes a vacuum transfer chamber 103 that can withstand a pressure (negative pressure) lower than the atmospheric pressure, such as a vacuum state or the like. In the vacuum transfer chamber 103, a vacuum transfer robot 112 is installed as an example of a transfer device for transferring a substrate 200 under a negative pressure.

(Vacuum Transfer Chamber)

The vacuum transfer chamber 103 is connected to a loading spare chamber 122 for loading the substrate 200 into the vacuum transfer chamber 103 and an unloading spare chamber 123 for unloading the substrate 200 from the vacuum transfer chamber 103, via gate valves 244 and 127, respectively. An atmospheric transfer chamber 121 used under a substantially atmospheric pressure is connected to a front side of the spare chambers 122 and 123 via gate valves 128 and 129.

(Vacuum Transfer Robot)

Figure 3A:
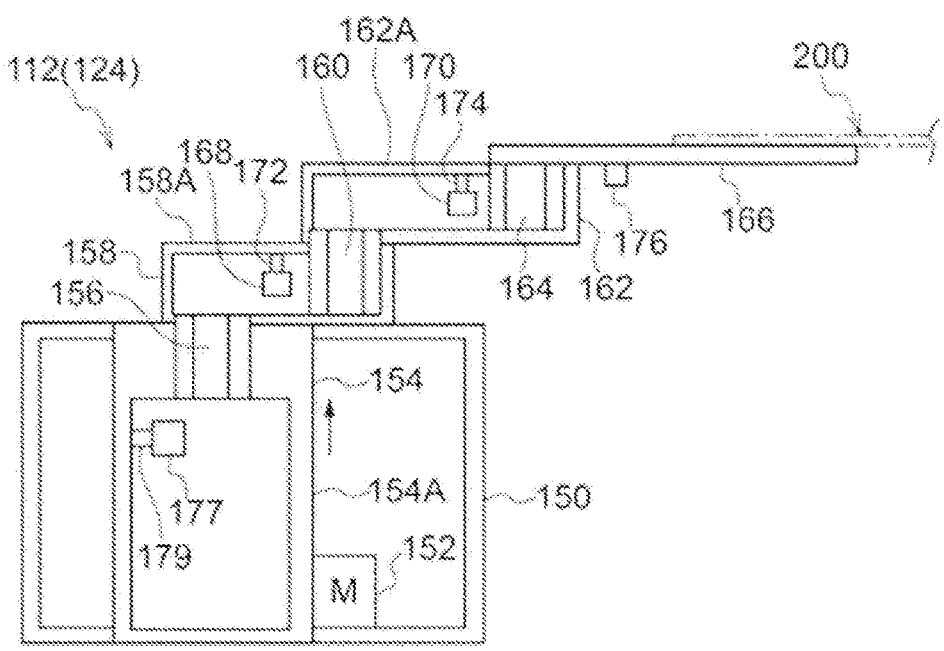
FIG. 3A is a vertical sectional view showing a vacuum robot.
Figure 3B:
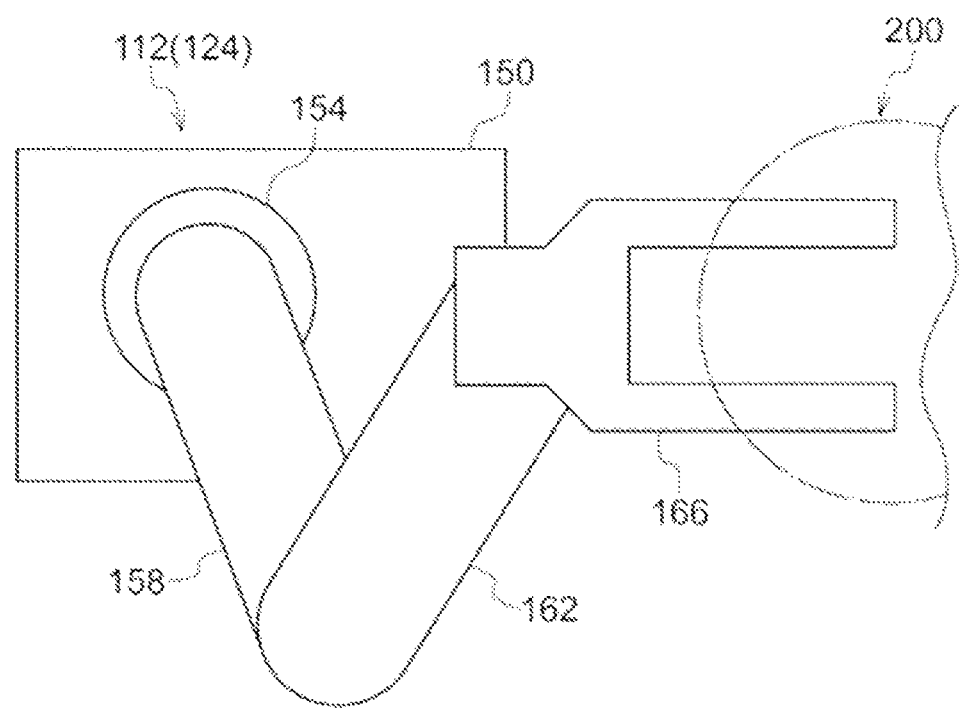
FIG. 3B is a plan view showing the vacuum robot.

As shown in FIGS. 3A and 3B, the vacuum transfer robot 112 of the present embodiment includes a box-shaped robot pedestal 150. An elevator 154 driven by a motor 152 is installed in the robot pedestal 150.

At the upper portion of the elevator 154, there is installed a first arm 158 that can be swiveled in the horizontal direction by a first arm driver 156 installed at the upper portion of the elevator 154.

At the end of the first arm 158, there is installed a second arm 162 that can be swiveled in the horizontal direction by a second arm driver 160 installed at the end of the first arm 158.

At the end of the second arm 162, there is installed a tweezer 166 that can be swiveled in the horizontal direction by a tweezer driver 164 installed at the end of the second arm 162. The substrate 200 is transferred while being mounted on the tweezer 166.

Each of the first arm 158, the second arm 162, the elevator 154 and the robot pedestal 150 has a closed hollow structure, and the inside thereof is filled with a gas (e.g., air).

In the present embodiment, a first microphone 168 is installed inside the first arm 158, a second microphone 170 is installed inside the second arm 162, and a third microphone 177 is installed inside the elevator 154.

The first microphone 168 is configured not to pick up the vibration of the housing 158A by being attached to an inner wall of a housing 158A, which constitutes an outer shell of the first arm 158, via an elastic body 172 such as rubber or a spring as shown in FIG. 3A. The first microphone 168 can pick up the sound generated inside the first arm 158. The sound information (audio signal) outputted from the first microphone 168 is sent to a below-described sound information receiver 231 by wire or wirelessly.

The second microphone 170 is attached to the inner wall of a housing 162A constituting the outer shell of the second arm 162 via an elastic body 174 such as rubber or a spring. The second microphone 170 can pick up the sound generated inside the second arm 162 (the sound of the tweezer driver 164). The sound information (voice signal) is transmitted to the sound information receiver 231 by wire or wirelessly.

The third microphone 177 is attached to the inner wall of a housing 154A constituting the outer shell of the elevator 154 via an elastic body 179 such as rubber and a spring. The third microphone 177 can pick up the sound generated inside the elevator 154 (the sound of the first arm driver 156). The sound information (voice signal) is transmitted to the sound information receiver 231 by wire or wirelessly.

A vibration sensor 176 is attached to the tweezer 166. The vibration sensor 176 detects the vibration of the tweezer 166. The vibration detection information is transmitted to a below-described vibration information receiver 230 by wire or wirelessly. The vibration sensor 176 is composed of, for example, an acceleration sensor.

The vacuum transfer robot 112 needs to accurately receive and deliver the substrate 200 using the tweezer 166. When the tweezer 166 vibrates more than expected, it may be determined that it is difficult to accurately receive and deliver the substrate 200. Therefore, the failure of the vacuum transfer robot 112 according to the vibration state (the difference in vibration waveform, the magnitude of vibration, etc.) may be detected by detecting the vibration of the tweezer 166 during the transfer of the substrate 200 by the vacuum transfer robot 112.

(Atmospheric Transfer Chamber)

Figure 2:
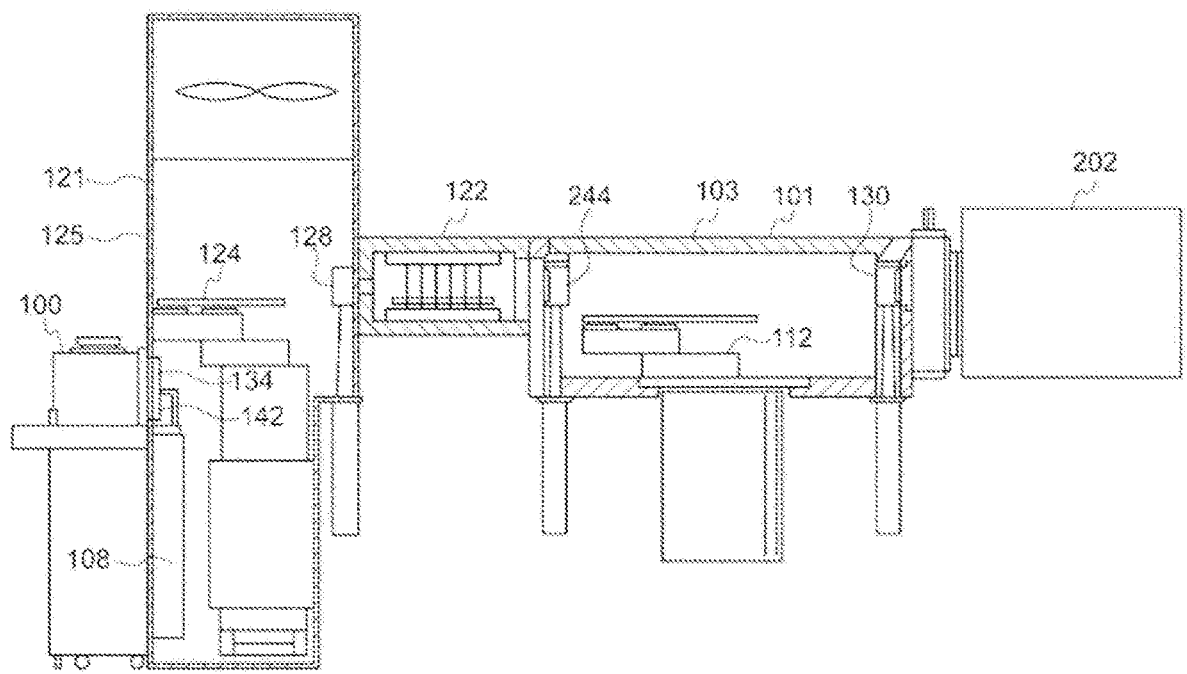
FIG. 2 is a partially-sectional side view showing the outline of the substrate processing apparatus.

As shown in FIGS. 1 and 2, an atmospheric transfer robot 124 as an example of a transfer device for transferring the substrate 200 is installed in the atmospheric transfer chamber 121. In the atmospheric transfer chamber 121, there are installed a substrate loading/unloading port 134 for loading and unloading the substrate 200 into and out of the atmospheric transfer chamber 121, a lid 142 for closing the substrate loading/unloading port 134, and a pod opener 108. In the atmosphere transfer chamber 121, an orientation flat aligner 106 is installed on the left side.

The pod opener 108 allows the substrate 200 to be taken into and out of the pod 100 by opening and closing the cap of a pod 100 mounted on an IO stage 105 and the lid 142 for closing the substrate loading/unloading port 134.

A first process furnace 202 and a second process furnace 137, which are respectively configured by cold-wall type process furnaces, and a first cooler 138 and a second cooler 139, which are configured to cool the processed substrates 200, are connected to the vacuum transfer chamber 103 via gate valves 130.

(Atmospheric Transfer Robot)

Since the atmospheric transfer robot 124 of the present embodiment includes the same configuration as the vacuum transfer robot 112, detailed description thereof will be omitted. The atmospheric transfer robot 124 of the present embodiment is configured to be able to transfer the substrate 200 like the vacuum transfer robot 112. The atmospheric transfer robot 124 can self-travel inside the atmospheric transfer chamber 121 (in the left-right direction in FIG. 1).

Likewise, the vacuum transfer robot 112, the first microphone 168 of the first arm 158, the second microphone 170 of the second arm 162, and the vibration sensor 176 of the tweezer 166 in the atmospheric transfer robot 124 are configured to transmit sound information and vibration information to the sound information receiver 231 by wire or wirelessly.

(Process Furnace)

As shown in FIG. 1, the process furnace 202 is configured as a single-substrate type CVD furnace (single-substrate type cold-wall type CVD furnace) and is installed with a chamber 204 in which a process chamber for processing the substrate 200 is formed.

The substrate 200 is loaded into and unloaded out of the process furnace 202 by the vacuum transfer robot 112 via a substrate loading/unloading port (not shown).

A cooling pipe (not shown) through which cooling water can flow is embedded in the chamber 204. The cooling pipe is connected to a cooling water supply device 178 installed outside the process furnace 202 via a pipe 180. A valve 182 for controlling the flow of a fluid and a flow meter 183 are installed in the pipe 180. A vibration sensor 184 and a microphone 186 are attached to the pipe 180 (or the valve 182). Each component installed in the pipe 180 is connected to the pipe 180 via a joint such as a flange or the like.

The vibration sensor 184 can detect the vibration of the pipe 180 (or the valve 182), and the microphone 186 can pick up the sound generated from the pipe 180 (or the valve 182). The vibration detection information is transmitted to the vibration information receiver 230 by wire or wirelessly, and the sound detection information is transmitted to the sound information receiver 231 by wire or wirelessly.

Further, a processing gas supply device 188 configured to supply a processing gas for processing the substrate 200 is connected to the chamber 204 via a pipe 190, and an exhaust device 192 configured to exhaust the processing gas in the chamber 204 is connected to the chamber 204 via a pipe 194.

(Controller)

Figure 4A:
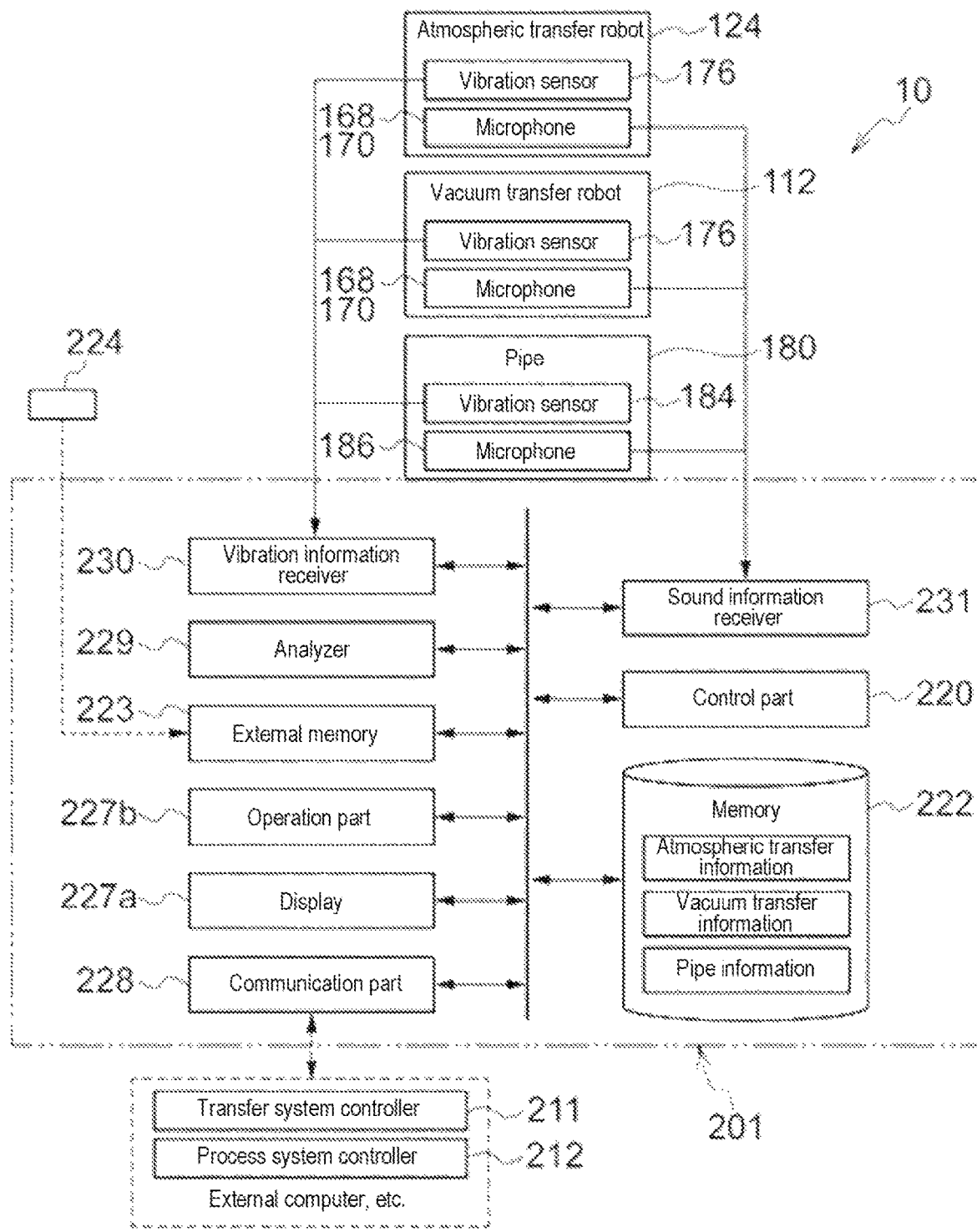
FIG. 4A is a block diagram showing a control system.

As shown in FIG. 4A, the substrate processing apparatus 10 includes a controller 201. The controller 201 includes a vibration information receiver 230 configured to acquire vibration information of the mechanical parts of the substrate processing apparatus 10, and a sound information receiver 231 configured to acquire sound information generated during the operation of the mechanical parts.

In the substrate processing apparatus 10, the controller 201 controls the entire apparatus (a transfer system controller 211, a process system controller 212, etc.). The controller 201 includes an external memory 223 configured to manage connection with an external connection device, an operation part 227b configured to receive various instructions from an operator, a display 227a configured to display various information such as a substrate processing status and the like, a vibration information receiver 230 configured to receive vibration information from the vibration sensors 176 and 184 installed in the vacuum transfer robot 112, the atmospheric transfer robot 124, the pipe 180, etc., a sound information receiver 231 configured to receive sound information from the first microphone 168, the second microphone 170, the third microphone 177 and the microphone 186 installed in the vacuum transfer robot 112, the atmospheric transfer robot 124, the pipe 180, etc., an analyzer 229 configured to analyze information received from the vibration information receiver 230 and the sound information receiver 231, a control part 220 capable of controlling the entirety of the substrate processing apparatus 10, a memory 222 configured to store vibration information and sound information received from the vibration information receiver 230 and the sound information receiver 231, and so forth. The analyzer 229 may be configured to include at least one of an abnormality detector and a failure detector. Although the analyzer 229 is shown in FIG. 4A as a different configuration from the control part 220, the analyzer 229 may be configured as a part of the control part 220. For example, the analyzer 229 may be configured as an analysis program, and the analysis program may be configured to be executed by a CPU 220A installed in the control part 220. Further, the abnormality detector and the failure detector may be configured as programs. These programs may also be configured to be executed by the CPU 220A. It should be noted that these programs are configured to be recordable in the memory 222.

Figure 4B:
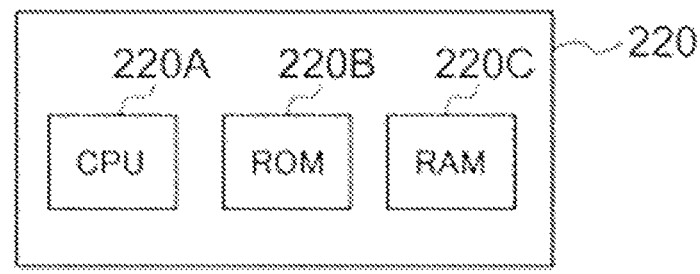
FIG. 4B is a diagram showing an example of the configuration of a control part.

As an example, as shown in FIG. 4B, the control part 220 is a computer configured to include a CPU 220A, a ROM 220B, a RAM 220C, and the like, but may be configured by a dedicated control circuit.

The term operator includes not only an apparatus operator, but also an apparatus manager, an apparatus engineer, maintenance staff, and a worker.

The memory 222 stores not only the vibration information and the sound information received from the vibration information receiver 230 and the sound information receiver 231, but also event information as a condition for accumulating and storing the vibration information and the sound information. The event information is, for example, information generated at a timing when the mechanical parts of the vacuum transfer robot 112 and the atmospheric transfer robot 124 start and stop the operations thereof. In the case of the cooling water supply device 178, the event information indicates, for example, the information generated at a timing when the valve 182 for controlling the flow of the fluid is opened and closed.

A communication part 228 may cause information to be exchanged between the transfer system controller 211, the process system controller 212, an external computer, and the like.

The vibration information receiver 230, the analyzer 229, the external memory 223, the operation part 227b, the display 227a, the communication part 228, the sound information receiver 231 and the control part 220, and the memory 222 are connected to each other by a bus 232 and are configured to exchange various kinds of information and commands.

As an example, the external memory 223 may be configured so that an external recording medium (a USB memory or the like) 224 can be connected thereto. The external recording medium 224 may store a program for executing a substrate processing process, an abnormality detection process, a failure detection process, and the like to be described below.

(Operation and Effect)

First, an example of the substrate processing process of the substrate processing apparatus 10 of the present embodiment will be described. As shown in FIGS. 1 and 2, the pod 100 is mounted on the IO stage 105 while accommodating a plurality of substrates 200 therein and opened by the pod opener 108. The substrate 200 is picked up by the atmospheric transfer robot 124 in the atmospheric transfer chamber 121 and loaded into the spare chamber 122 from the opened gate valve 128.

Next, the gate valve 128 is closed, and the spare chamber 122 is exhausted to a negative pressure by an exhaust device (not shown). When the pressure in the spare chamber 122 is reduced to a preset pressure value, the gate valve 244 and the gate valve 130 are opened to bring the spare chamber 122, the vacuum transfer chamber 103 and the first process furnace 202 into communication with each other. The substrate 200 is loaded from the spare chamber 122 into the first process furnace 202 by the vacuum transfer robot 112 via the substrate loading/unloading port 250.

After the vacuum transfer robot 112 exits from the first process furnace 202, the substrate loading/unloading port 250 is closed by the gate valve 244. Thereafter, the gas in the first process furnace 202 accommodating the substrate 200 is exhausted by the exhaust device 192.

Next, the cooling water is allowed to flow from the cooling water supply device 178 to the first cooling water pipe 2a and the second cooling water pipe 2b of the process furnace 202, and the substrate 200 is heated by a heater (not shown). When the temperature of the substrate 200 rises to a processing temperature, a processing gas is supplied from the processing gas supply device 188 into the process furnace 202, and a desired process is performed on the substrate 200.

When a preset processing time elapses, the gas in the process furnace 202 is exhausted by the exhaust device 192. Next, the gate valve 130 is opened. The processed substrate 200 is transferred to the vacuum transfer chamber 103 by the vacuum transfer robot 112 and then carried into the first cooler 138 where the processed substrate 200 is cooled.

After a preset cooling time has elapsed in the first cooler 138, the substrate 200 is transferred from the first cooler 138 to the vacuum transfer chamber 103 by the vacuum transfer robot 112.

Thereafter, the gate valve 127 is opened, the substrate 200 is transferred to the spare chamber 123 by the vacuum transfer robot 112, the gate valve 127 is closed, and the inside of the spare chamber 123 is returned to a substantially atmospheric pressure by an inert gas.

Next, the lid 142 and the cap of the pod 100 are opened by the pod opener 108, and the substrate 200 is accommodated in the empty pod 100 by the atmospheric transfer robot 124. By repeating the above operations, the substrate 200 is sequentially processed.

(Vibration Information and Sound Information)

In the substrate processing apparatus 10 of the present embodiment, an abnormality detection process and a failure detection process of the substrate processing apparatus 10 are performed in parallel with the above-described substrate processing process.

Hereinafter, the abnormality detection process and the failure detection process of the operation of the tweezer 166 of the vacuum transfer robot 112 will be described below as a representative.

Figure 5:
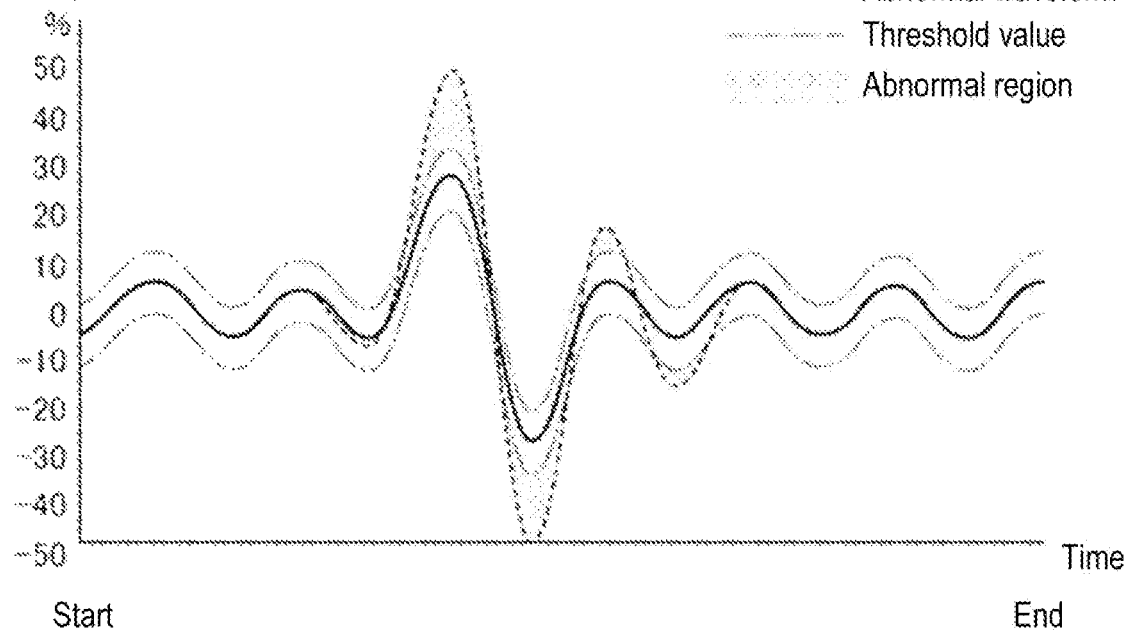
FIG. 5 is a graph showing the relationship between waveform data and a threshold value.

First, for example, the memory 222 of the controller 201 pre-stores a threshold value of the sound of the tweezer driver 164 (the threshold value is a range between an upper waveform and a lower waveform indicated by one-dot chain lines and has a predetermined width) as shown in the graph of FIG. 5, and pre-stores a threshold value of the vibration (the threshold value is a range between an upper waveform and a lower waveform indicated by one-dot chain lines and has a predetermined width) as shown in FIG. 5.

In the graph of FIG. 5, in addition to waveform data of the sound threshold value, there are shown the normal waveform (indicated by a solid line) of the sound actually picked up by the second microphone 170 at the normal time (for example, at the time of new product) and the abnormal waveform (indicated by a dotted line) of the sound actually picked up by the second microphone 170 at the abnormal time.

Although not shown, the memory 222 stores a vibration threshold value as in FIG. 5.

(Example of Detection Process)

Figure 6:
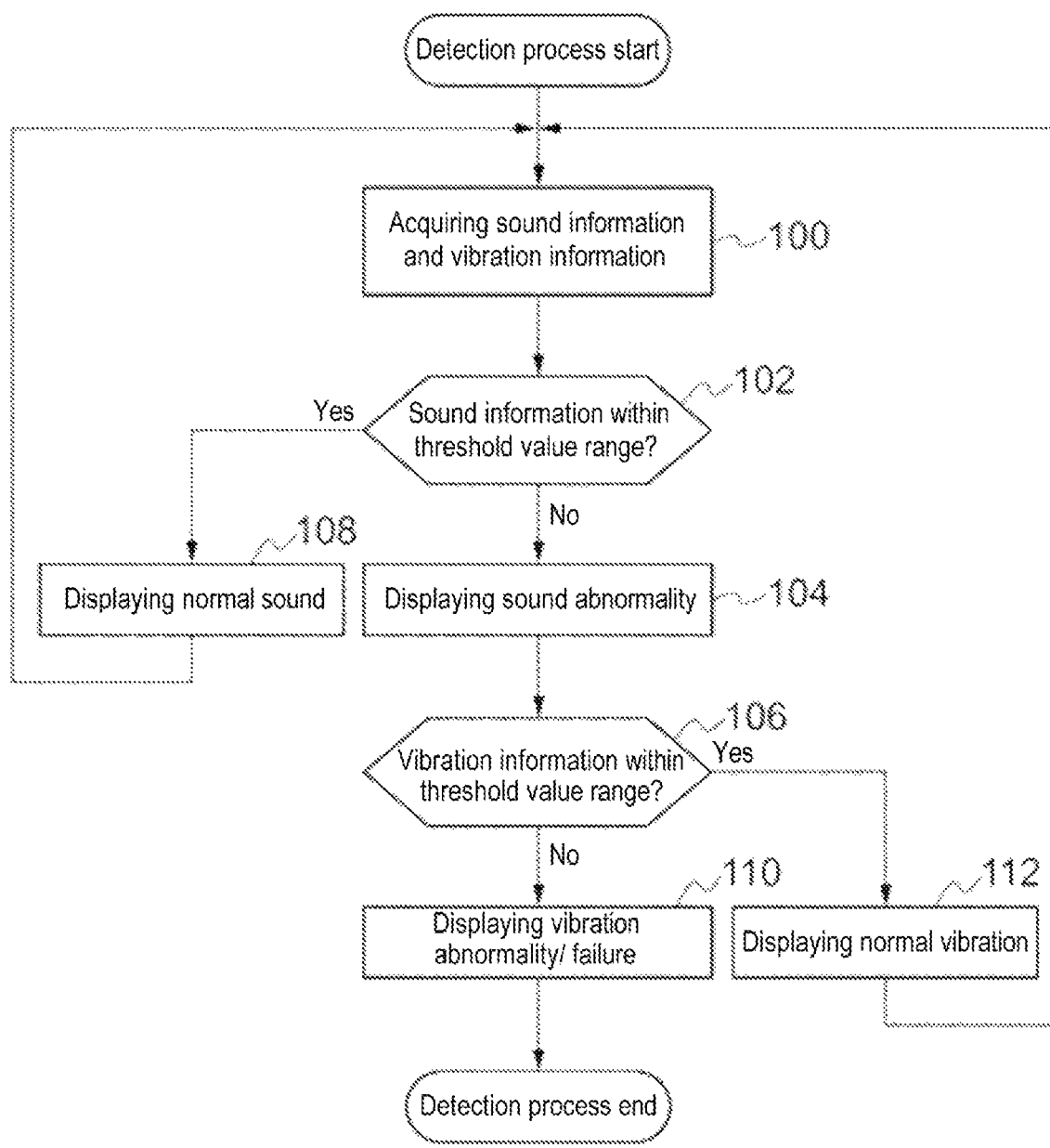
FIG. 6 is a flowchart showing a detection process according to the first embodiment.

Next, an example of the abnormality detection process and the failure detection process will be described according to the flowchart shown in FIG. 6. These detection processes are started at the timing when one event (one operation) of the tweezer 166 is performed, and are continuously executed until the event comes to an end.

First, in step 100, the second microphone 170 acquires the sound information of the tweezer driver 164 for driving the tweezer 166, and the vibration sensor 176 acquires the vibration information of the tweezer 166. The sound information and the vibration information are transmitted to the sound information receiver 231.

In step 102, the analyzer 229 compares the transmitted sound information with the threshold value. The analyzer 229 determines whether the waveform of the sound information deviates from the threshold value. If it is determined that the waveform of the sound information deviates from the threshold value (for example, if the waveform of the transmitted sound information is the abnormal waveform indicated by the dotted line in FIG. 5), the process proceeds to step 104.

The abnormality referred to herein means that, as an example, the waveform of the sound is different from that in the normal state (for example, at the time of new product) and no problem is posed to the normal operation. Examples of the sound at the abnormal time includes a rattling sound when a small rattling occurs in the tweezer driver 164 for driving the tweezer 166, an abnormal noise generated when the lubricating oil is about to run out, and the like.

In step 104, a message notifying that the sound of the tweezer driver 164 is abnormal is displayed on the display 227a. Then the process proceeds to step 106.

On the other hand, if it is determined in step 102 that the waveform of the sound information does not deviate from the threshold value, the process proceeds to step 108. A message notifying that the sound of the tweezer driver 164 is normal is displayed on the display 227a. Then the process returns to step 100.

In step 106, as in the case of the sound information, the analyzer 229 determines whether the waveform of the vibration information deviates from the threshold value. If it is determined that the waveform of the vibration information deviates from the threshold value (in other words, if it is determined that a failure has occurred), the process proceeds to step 110. If it is determined that the waveform of the vibration information does not deviate from the threshold value (in other words, if there is generated slight vibration that does not interfere with the transfer operation or the like), the process proceeds to step 112.

In step 110, a failure message indicating that the vibration of the tweezer driver 164 is abnormal, i.e., that the tweezer driver 164 is out of order is displayed on the display 227a. Then the process comes to an end. If the vibration is abnormal, the operation of the vacuum transfer robot 112 may be stopped and an alarm sound may be emitted by an alarm device or the like.

In step 112, a message notifying that the vibration of the tweezer driver 164 falls within a normal range is displayed on the display 227a. Then the process returns to step 100.

The abnormality detection process and the failure detection process for the tweezer 166 of the vacuum transfer robot 112 have been described above as a representative. The same process is performed for other drivers (the first arm driver 156 and the second arm driver 160) of the vacuum transfer robot 112.

As described above, in the vacuum transfer robot 112 of the present embodiment, the presence/absence of sound abnormality and the presence/absence of failure are displayed on the display 227a for each event of each driver. Therefore, the operator can grasp the operating status of each part of the vacuum transfer robot 112 by looking at the message displayed on the display 227a.

For the atmospheric transfer robot 124 of the present embodiment, an abnormality detection process and a failure detection step can also be performed in the same manner as those for the vacuum transfer robot 112.

Further, in the substrate processing apparatus 10 of the present embodiment, the microphone 186 and the vibration sensor 184 are attached to the pipe 180 (or the valve 182) of the cooling system. Therefore, the sound and vibration of the valve 182 may be detected by the microphone 186 and the vibration sensor 184, and the abnormality detection process and the failure detection process may be performed in the same manner as those for the vacuum transfer robot 112 to detect the abnormality or failure of the valve 182.

As described above, according to the present embodiment, it is possible to detect a failure of the device, and it is possible to detect an abnormality of the transfer device before the device fails. By detecting an abnormal noise generated from the device, it is possible to perform the finding, inspection, and repair preparation of a defective part fast in advance.

Second Embodiment

Next, an abnormality detection process and a failure detection process for the substrate processing apparatus 10 according to the second embodiment will be described with reference to FIGS. 7 to 10. Since the apparatus configuration (hardware) of the substrate processing apparatus 10 according to the second embodiment is the same as that of the substrate processing apparatus 10 according to the first embodiment, the description thereof will be omitted.

The substrate processing apparatus 10 according to the second embodiment is different from the first embodiment in terms of the abnormality detection process and the failure detection process. In the first embodiment, the threshold values for the sound information and the vibration information are fixed. However, in the present embodiment, a correction value is calculated from the difference from the accumulated past waveform data (e.g., a previous waveform data or an average value of the past waveform data) and is added to a threshold value. This makes it possible to obtain a more accurate threshold value and to perform abnormality detection and vibration detection using the highly accurate threshold value.

For example, in break-in operation or final test (operation confirmation test, etc.) performed by a manufacturer at the time of shipment from the factory, it is possible to obtain sound information and vibration information of each part and to set a threshold value based on the sound information and vibration information. However, when the substrate processing apparatus 10 (the vacuum transfer robot 112, the atmospheric transfer robot 124, etc.) is disassembled and reassembled at the place where the user uses the apparatus 10, the sound and vibration generated in each part may be changed during the use by the user due to an assembly error and other factors.

Therefore, when the user first uses the apparatus (for example, trial use of the apparatus before using it on a user's line), the sound information and the vibration information may deviate from the threshold value set by the manufacturer at the time of shipment. Therefore, there is a concern that an abnormality or a failure is displayed even when an abnormality or a failure does not occur.

Therefore, in the substrate processing apparatus 10 according to the present embodiment, the threshold values of sound and vibration are automatically corrected.

Figure 7:
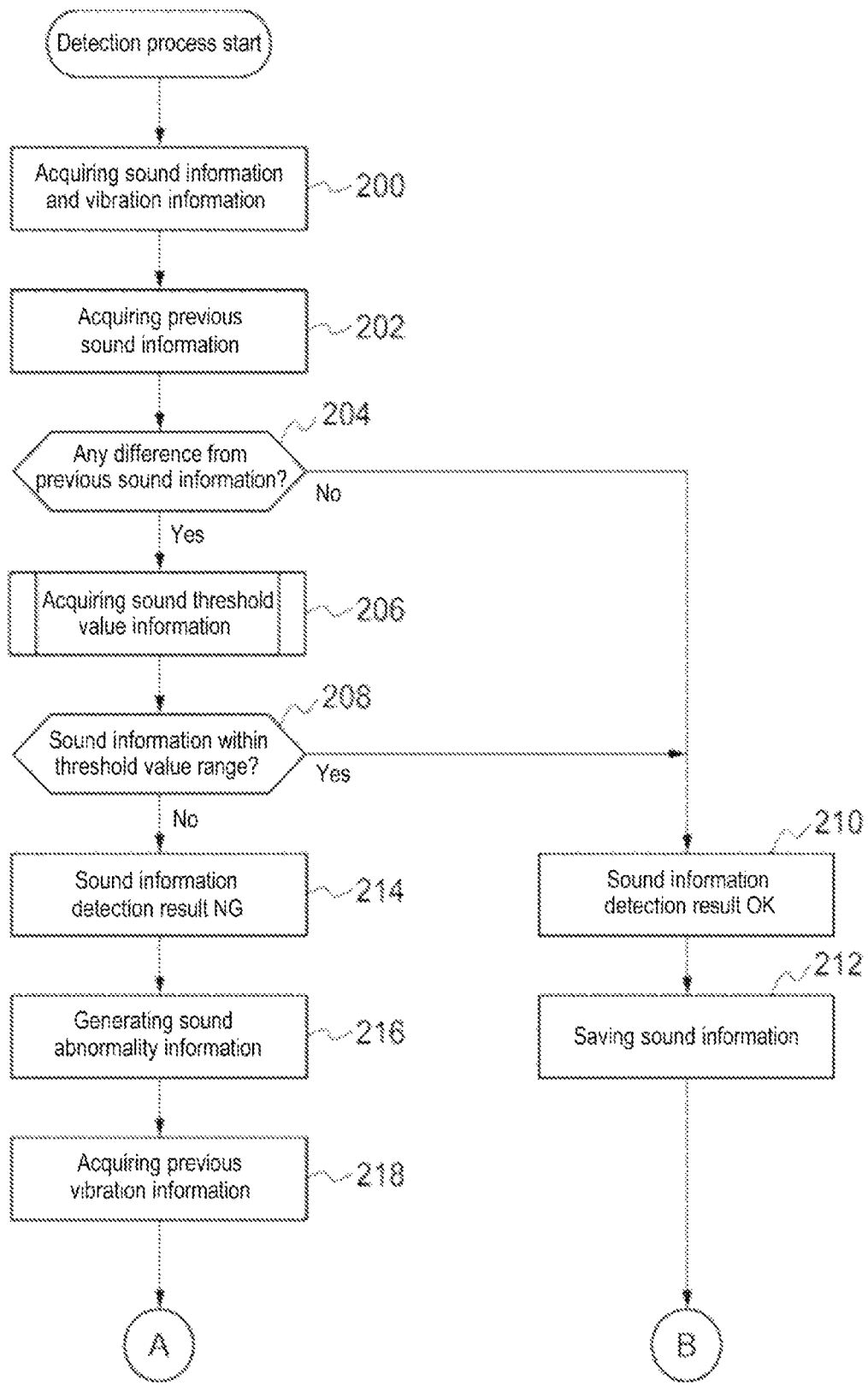
FIG. 7 is a flowchart showing the former half of a detection process according to a second embodiment.

Hereinafter, an example of the abnormality detection process and the failure detection process in the substrate processing apparatus 10 according to the second embodiment will be described according to the flowcharts shown in FIGS. 7 and 8.

First, in step 200, the second microphone 170 acquires the sound information of the tweezer driver 164 for driving the tweezer 166, and the vibration sensor 176 acquires the vibration information of the tweezer 166. The sound information and the vibration information are transmitted to the sound information receiver 231.

In step 202, the sound information stored in the previous event is acquired. As an example, when the user drives the apparatus for the first time, the sound information (sound data (waveform)) stored in the memory 222 at the time of shipment from the factory is that stored in the previous event. Further, when the user drives the apparatus a plurality of times, the sound information (sound data (waveform)) when the user drives the apparatus (see FIG. 9) is that stored in the previous event.

In step 204, it is determined whether there is a difference between the sound information acquired in step 200 and the previous sound information. If there is a difference, the process proceeds to step 206. If there is no difference, the process proceeds to step 210.

In step 210, the sound information (within the threshold value range) acquired in step 200 is sent to the memory 222.

Then, in subsequent step 212, the sound information is stored in the memory 222. The sound information can be accumulated for each event (see FIG. 9). Further, the sound information stored in the memory 222 may be used for the correction of the threshold value.

On the other hand, in step 206, a correction value is calculated from the difference between the sound information acquired in step 200 and the sound information stored in the memory 222. The calculated correction value is added to the threshold value to generate a new threshold value. The analyzer 229 acquires the threshold value thus generated.

As an example, the graph on the left side in FIG. 10 shows the relationship between the first waveform (e.g., the waveform stored at the time of shipment from the factory) and the second waveform (e.g., the waveform acquired at the first event on the user side), and the threshold value at the time of shipment from the factory. In the example shown on the left side in FIG. 10, it is shown that both the first waveform and the second waveform fall within the threshold value range at the time of shipment from the factory. The shape of the second waveform is different from the shape of the first waveform, and a part of the second waveform is close to the waveform at the lower limit of the threshold value.

When the shape of the second waveform is different from the shape of the first waveform as described above, a correction value is calculated and is added to the threshold value to generate a new threshold value. The threshold value thus generated is acquired by the analyzer 229 and can be used in the next detection process.

The graph on the right side in FIG. 10 shows the relationship between the second waveform (e.g., the waveform acquired at the first event on the user side), the third waveform (waveform acquired at the second event on the user side) and the corrected threshold value. Since the threshold value indicated in the graph on the right side in FIG. 10 is a threshold value corrected in consideration of the waveform acquired at the second event on the user side, the waveform of the information acquired at the second event is located at the center between the upper limit value and the lower limit value of the corrected threshold value. The graph on the right side in FIG. 10 shows that the third waveform deviates from the corrected threshold value.

In step 208, the sound information acquired in step 200 is compared with the threshold value. The analyzer 229 determines whether the waveform of the sound information deviates from the threshold value. If it is determined that the waveform of the sound information deviates from the threshold value, the process proceeds to step 214. If it is determined that the waveform does not deviate from the threshold value, the process proceeds to step 210.

In step 214, the sound information acquired in step 200 is sent to the memory 222 as sound information deviating from the threshold value.

In step 216, sound abnormality information is generated by acquiring the sound information deviating from the threshold value.

In subsequent step 218, the vibration information stored in the previous event is acquired. As an example, when the user drives the apparatus for the first time, the vibration information (vibration data (waveform)) stored in the memory 222 at the time of shipment from the factory is that stored in the previous event. Further, when the user drives the apparatus a plurality of times, the vibration information (vibration data (waveform)) when the user drives the apparatus (see FIG. 9) is that stored in the previous event.

Figure 8:
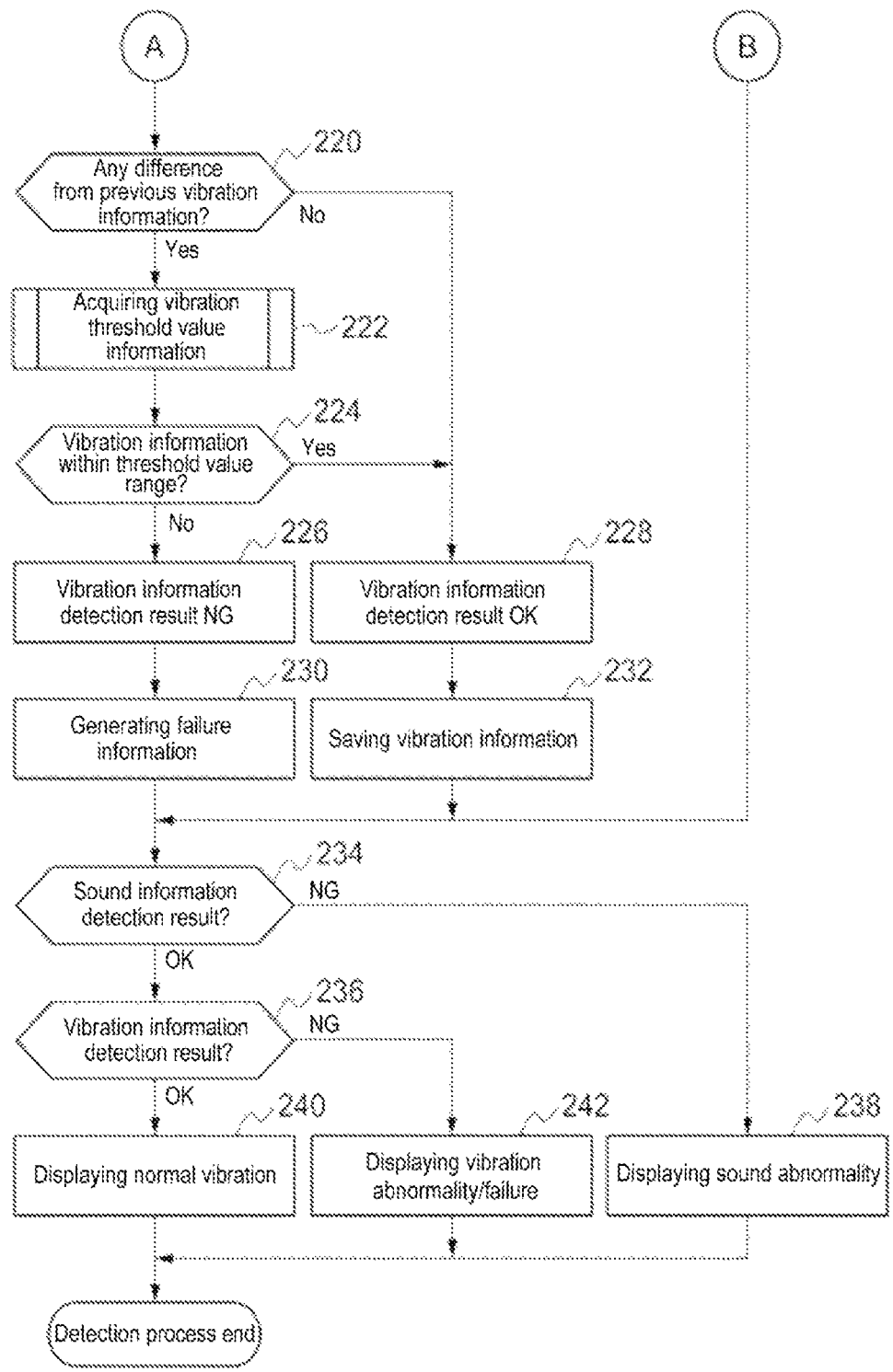
FIG. 8 is a flowchart showing the latter half of the detection process according to the second embodiment.
Figure 9:
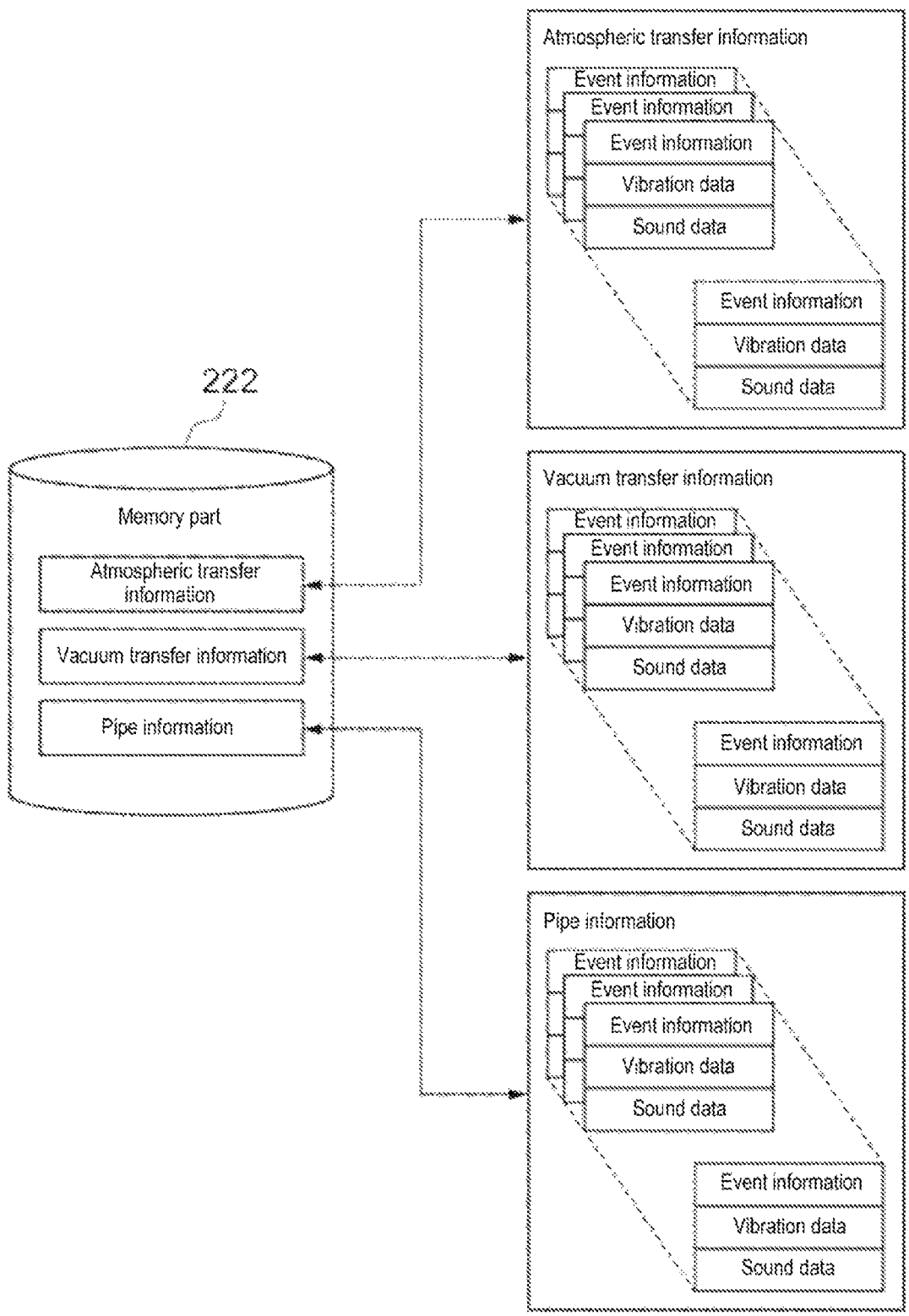
FIG. 9 is an explanatory diagram illustrating the information given and received by a memory according to the second embodiment.

As shown in FIG. 8, in step 220, it is determined whether there is a difference between the vibration information acquired in step 200 and the previous vibration information. If there is a difference, the process proceeds to step 222.

In step 222, the analyzer 229 acquires the vibration threshold value information stored in the memory 222.

In step 224, the vibration information acquired in step 200 is compared with the threshold value. The analyzer 229 determines whether the waveform of the vibration information deviates from the threshold value. If it is determined that the waveform of the vibration information deviates from the threshold value, the process proceeds to step 226. If it is determined that the waveform of the vibration information does not deviate from the threshold value, the process proceeds to step 228.

Then, in subsequent step 232, the vibration information is stored in the memory 222. This vibration information becomes the sound information used in step 202 at the next event.

In step 226, the vibration information of the tweezer driver 164 acquired in step 200 is sent to the memory 222 as vibration information deviating from the threshold value.

In step 230, failure information is generated by acquiring the vibration information deviating from the threshold value.

In step 232, the vibration information is stored in the memory 222. This vibration information becomes the vibration information used in step 218 at the next event.

In step 234, presence or absence of the sound abnormality information (sound information detection result acquired in step 214) is determined. If the sound is abnormal (there is sound abnormality information), the process proceeds to step 238. If the sound is normal (there is no sound abnormality information or there is sound information falling within the threshold value range), the process proceeds to step 236.

In step 238, a message notifying that the sound of the tweezer driver 164 is abnormal is displayed on the display 227a.

In step 236, presence or absence or the failure information (acquired in step 230) is determined. If there is failure information, the process proceeds to step 242. A failure message is displayed on the display 227a. If there is no failure information, the process proceeds to step 240. A message notifying that the vibration of the tweezer driver 164 falls within the normal range is displayed on the display 227a.

In the present embodiment, the correction value is calculated based on the difference between the latest waveform data and the accumulated past waveform data, and the calculated correction value is added to the threshold value. Therefore, a highly accurate threshold value can be obtained, and abnormality detection and vibration detection can be performed using the highly accurate threshold value. This makes it possible to suppress false detection.

The abnormality detection process and the failure detection process for the vacuum transfer robot 112 according to the second embodiment have been described above. For the atmospheric transfer robot 124 and the valve 182, the abnormality detection process and the failure detection process can be performed in the same manner as that for the vacuum transfer robot 112.

OTHER EMBODIMENTS

Although the embodiments of the present disclosure have been described above, the present disclosure is not limited to the above-described embodiments. It is possible to perform in various modifications other than the above embodiments without departing from the gist of the present disclosure.

In the vacuum transfer robot 112 of the above-described embodiments, each of the first arm 158, the second arm 162, elevator 154, and the robot pedestal 150 has a hollow structure, and the inside of the sealed housing 158A is filled with a gas (e.g., air). The inside may communicate with the outside and may be kept in a vacuum state. In such a case, if a gas-filled container filled with a gas is placed near the driver and if a microphone is installed inside the gas-filled container, it is possible to indirectly pick up the sound generated from the driver.

In the atmospheric transfer robot 124, the microphone (reference numeral 181 in FIG. 1) may be installed outside the robot instead of inside the robot to pick up the operating sound of the driver. By installing the microphone 181 in the vicinity of the atmospheric transfer robot 124, the sound generated from each driver of the atmospheric transfer robot 124 can be picked up by one microphone 181. This makes it possible to reduce the number of microphones.

The controller 201 according to the embodiments of the present disclosure can be realized by using an ordinary computer system without having to use the dedicated system (circuit). For example, the controller 201 that executes the above-mentioned process may be configured by installing, on a general-purpose computer, a control program from an external recording medium (a USB memory, an external HDD, or the like) that stores the control program for executing the above-mentioned process.

The means for supplying the program is arbitrary. In addition to being able to supply the program via a predetermined recording medium as described above, it may be possible to supply the program via, for example, a communication line, a communication network, a communication system, or the like. In this case, for example, the program may be posted on a bulletin board of a communication network and may be provided via the network by superimposing it on a carrier wave. Then, by starting the program provided in this way and executing it in the same manner as other application programs under the control of the OS, it is possible to execute the above-mentioned process.

In the above-described embodiment, the semiconductor manufacturing apparatus is shown as an example of the substrate processing apparatus. However, the substrate processing apparatus is not limited to the semiconductor manufacturing apparatus and may be an apparatus for processing a glass substrate such as an LCD device or the like. Further, the specific content of the substrate processing process is not limited and may include not only the film-forming process but also an annealing process, an oxidizing process, a nitriding process, a diffusion process, and the like. Further, the film-forming process may be, for example, a process for forming an oxide film or a nitride film, or a process for forming a film containing a metal.

The present disclosure is applicable to apparatuses (machines) other than the substrate processing apparatus as long as they are apparatuses (machines) that involve transfer and other operations.

In the present disclosure, the vibration information of the transfer robot or the like mainly refers to mechanical vibration. The mechanical vibration means, for example, that the vacuum transfer robot 112 or the like is mechanically vibrated by the dynamic force generated by the operation of the motor of the vacuum transfer robot 112 or the like. Further, in the present disclosure, the vibration information refers to the information on mechanical vibration. This mechanical vibration can be measured by measuring the acceleration of a vibrating object. That is, the vibration information of an object can be obtained by attaching a vibration sensor such as an acceleration sensor or the like to an object (machine) for which vibration information is to be measured or its surroundings.

In the present disclosure, the sound information is a sound wave generated by the vibration of an object and converted into an electric signal by an acoustic device (microphone).

In the present disclosure, both the vibration information and the sound information are information about vibration but have a difference in that the frequency of the vibration information (mechanical vibration information) is lower than the frequency of the sound information. It may be possible for a vibration sensor such as an acceleration sensor or the like to detect vibration information that cannot be detected by an acoustic device such as a microphone or the like, and it may be possible for an acoustic device such as a microphone or the like to detect sound information that cannot be detected by a vibration sensor such as an acceleration sensor or the like. For example, the vibration sensor cannot detect vibration information at a location distant from the position where the vibration sensor is attached, but the acoustic device can detect sound information at a distant location. Further, the vibration sensor may not be able to follow an operation because the detection of the vibration information or the reaction speed to the vibration are slow at the time of slow operation. However, the acoustic device can detect even a small amount of sound information. By obtaining two types of information (vibration information and sound information) using two types of vibration sensors in this way, it is possible to improve the accuracy of at least one or more of machine abnormality detection and abnormality prediction. The two types of vibration sensors refer to an acoustic device such as a microphone or the like and a vibration sensor such as an acceleration sensor or the like.

(Supplementary Note 1) Substrate Processing Apparatus

A substrate processing apparatus may include a transfer robot configured to transfer a substrate; a transfer chamber configured to accommodate the transfer robot; a process chamber configured to process the substrate; a vibration information receiver configured to receive vibration information for the transfer robot; a sound information receiver configured to receive sound information for the transfer robot; and a control part configured to control each configuration.

In the substrate processing apparatus described recited in Supplementary Note 1, it is possible to acquire the vibration sensor information and the vibration sound during the operation of the movable part of the transfer robot not only in the atmosphere but also in the vacuum. Use of these vibration and sound make it possible to detect an abnormality at each part and prevent a serious device failure.

(Supplementary Note 2) Vacuum Transfer Chamber

With respect to the apparatus of Supplementary Note 1, the transfer chamber may be a vacuum transfer chamber, and the transfer robot (vacuum transfer robot) capable of operating in a vacuum may be arranged in the vacuum transfer chamber.

In the substrate processing apparatus recited in Supplementary Note 2, the transfer robot (vacuum transfer robot) can transfer the substrate in the vacuum of the vacuum transfer chamber.

(Supplementary Note 3) Arrangement of Vibration Sensor of Vacuum Transfer Robot

With respect to the apparatus of Supplementary Note 2, the vacuum transfer robot may be installed with a sensor configured to detect vibration, the sensor configured to detect vibration may be arranged in a movable part of the vacuum transfer robot, and the vibration information receiver may be configured to receive the vibration information detected by the sensor configured to detect vibration.

In the substrate processing apparatus recited in Supplementary Note 3, the vibration when various mechanical parts operate can be detected by a vibration sensor. The vibration sensor is arranged inside or outside the vacuum transfer robot. The mechanical parts refer to, for example, drivers. Further, the movable parts refer to at least one of a driver, a tweezer, an arm, and the like.

(Supplementary Note 4) Arrangement of Microphone of Vacuum Transfer Robot

With respect to the apparatus of Supplementary Note 2, the vacuum transfer robot may be installed with a microphone configured to collect sound information, the microphone may be arranged inside the vacuum transfer robot to collect sound information in a vacuum, and the sound information receiver may be configured to receive the sound information collected by the microphone.

Since sound cannot be transmitted in a vacuum, the microphone is arranged near the internal movable part of the vacuum transfer robot filled with a gas. In the substrate processing apparatus recited in Supplementary Note 4, even if the vacuum transfer robot is arranged in a vacuum, it is possible to detect vibration noise when various mechanical parts of the vacuum transfer robot operate.

(Supplementary Note 5) Atmospheric Transfer Chamber

With respect to the apparatus of Supplementary Note 1, the transfer chamber may be an atmospheric transfer chamber, and the transfer robot (atmospheric transfer robot) capable of operating in the atmosphere may be arranged in the atmospheric transfer chamber.

In the substrate processing apparatus recited in Supplementary Note 5, the transfer robot (atmospheric transfer robot) can transfer the substrate in the atmosphere.

(Supplementary Note 6) Arrangement of Vibration Sensor of Atmospheric Transfer Robot With respect to the apparatus of Supplementary Note 5, the atmospheric transfer robot may be installed with a sensor configured to detect vibration, the sensor configured to detect vibration may be arranged in a movable part of the atmospheric transfer robot, and the vibration information receiver may be configured to receive the vibration information detected by the sensor configured to detect vibration.

In the substrate processing apparatus recited in Supplementary Note 6, the vibration when various mechanical parts are operated can be detected. The vibration sensor can be arranged inside or outside the atmospheric transfer robot.

(Supplementary Note 7) Arrangement of Microphone of Atmospheric Transfer Robot

With respect to the apparatus of Supplementary Note 5, the atmospheric transfer robot may be installed with a microphone configured to collect sound information, the microphone may be arranged around the atmospheric transfer robot to receive a sound of a movable part of the atmospheric transfer robot, and the sound information receiver may be configured to receive the sound information collected by the microphone.

In the substrate processing apparatus recited in Supplementary Note 7, the vibration sound when various mechanical parts of the atmospheric transfer robot are operated can be detected by the microphone.

(Supplementary Note 8) Fluid Flow Pipe

The apparatus of Supplementary Note 1 may further include a pipe through which a fluid flows; a sound information receiver configured to receive sound information for the pipe; and a vibration information receiver configured to receive vibration information for the pipe.

In the substrate processing apparatus recited in Supplementary Note 8, an abnormality in the pipe can be detected and a failure of the pipe can be detected as the vibration and sound of the fluid in the pipe through which the fluid flows are received by the vibration information receiver and the sound information receiver.

(Supplementary Note 9) Definition of Fluid

With respect to the apparatus of Supplementary Note 8, the fluid may include any of cooling water, a processing gas and a purge gas.

Depending on the type of fluid, impurities, corrosion, etc. may occur in at least one of a pipe, a valve and a cooling water supply device, and the fluid may not correctly flow through at least one of the pipe, the valve and the cooling water supply device.

In the substrate processing apparatus recited in Supplementary Note 9, by monitoring the flow of a fluid with vibration information and sound information, it is possible to detect an abnormality of at least one of the pipe, the valve and the cooling water supply device at an early stage. In addition, it is possible to detect a failure of the pipe.

(Supplementary Note 10) Definition of Pipe

With respect to the apparatus of Supplementary Note 8 or 9, the pipe may be connected to a flow meter, a valve, or a joint including a flange and configured to allow the fluid to flow therethrough.

The diameter of the pipe at a flow meter connection portion, a valve connection portion and a flange vicinity may differ from that at other locations due to tightening or the like, which may affect the fluid flow. In addition, impurities or precipitates due to corrosion, etc. may accumulate at these portions, thereby obstructing the fluid flow.

In the substrate processing apparatus recited in Supplementary Note 10, by monitoring the fluid flow with vibration information and sound information, it is possible to detect an abnormality in the pipe at an early stage, and it is possible to detect a failure of the pipe.

(Supplementary Note 11) Shape of Pipe

With respect to the apparatus of Supplementary Note 10, the pipe may be bent according to the shape of a device.

The fluid pipe may be bent according to the shape of the device. However, the bent portions of the pipe may affect the fluid flow because the shape of the bent portions of the pipe is different from the shape of other portions. Impurities or precipitates due to corrosion, etc. may accumulate at these portions, thereby obstructing the fluid flow.

In the substrate processing apparatus recited in Supplementary Note 11, by monitoring the fluid flow with vibration information and sound information, it is possible to detect an abnormality in the pipe at an early stage, and it is possible to detect a failure of the pipe.

(Supplementary Note 12) Arrangement of Vibration Sensor of Pipe

With respect to the apparatus of Supplementary Note 10 or 11, the vibration information receiver for the pipe may be arranged around the flow meter, the valve, the joint including the flange, or the bent portion that affects the fluid flow.

In the substrate processing apparatus recited in Supplementary Note 12, the abnormal vibration of the fluid can be detected by arranging the vibration sensor on the flow meter outlet side, the valve outlet side, or the flange outlet side. The vibration sensor may be attached around the pipe.

(Supplementary Note 13) Arrangement of Microphone of Pipe

With respect to the apparatus of Supplementary Note 10 or 11, the sound information receiver for the pipe may be arranged around the flow meter, the valve, the joint including the flange, or the bent portion that affects the fluid flow.

In the substrate processing apparatus recited in Supplementary Note 13, the abnormal sound of the fluid can be detected by arranging the microphone on the flow meter outlet side, the valve outlet side, or the flange outlet side. The microphone may be attached around the pipe.

(Supplementary Note 14) Definition of Analyzer

The apparatus of Supplementary Note 1 may further include an analyzer configured to analyze the vibration information received by the vibration information receiver and the sound information received by the sound information receiver.

When the vibration information is received by the vibration information receiver or when the sound information is received by the sound information receiver, the analyzer can superimpose the history information in the memory as waveform data and can confirm the difference in the data.

If there is a difference in the waveform data as a result of superimposition and if the obtained difference exceeds a predetermined threshold value range, it is determined to be abnormal. If there is no difference or if the obtained difference falls within the threshold value range, it is determined to be normal.

If it is determined to be abnormal, the abnormality is notified to the control part. The control part can stop the operation of the mechanism or stop the supply of the fluid.

In addition, it is possible to indicate the abnormality on the display and encourage maintenance of parts.

For example, in the case of the transfer robot, the waveform data may be vibration information generated from the start of the operation of the mechanism to the stop of the operation.

The operation start and operation stop of the mechanism can be performed at the timing when the event information (an event indicating operation start, or an event indicating operation stop) is received from the transfer system controller.

For the waveform data in the case of the pipe, for example, in the case of a processing gas pipe, it is possible to determine the start/end of information collection at the opening/closing timing (an event indicating valve opening/closing) of the valve connected to the pipe.

In the substrate processing apparatus recited in Supplementary Note 14, it is easy to detect an abnormality by comparing the differences in the waveform data.

By setting the collection timing of vibration information and sound information to various kinds of event information, the effective range of data in the memory or the analyzer becomes clear.

(Supplementary Note 15) Definition of Display (Vibration Information)

With respect to the apparatus of Supplementary Note 14, when the vibration information analyzed by the analyzer is an abnormal value, the control part may display an abnormal state of the transfer robot or the pipe on a display.

In the substrate processing apparatus recited in Supplementary Note 15, when an abnormality occurs in the comparison of the waveform data of the vibration information, a message indicating the abnormality of the portion is displayed on the display. In addition, the relevant portion may be included in the message from the event information at the time of abnormality detection.

In the substrate processing apparatus recited in Supplementary Note 15, the operator is made to recognize the abnormality by displaying a message when the abnormality is detected.

In the case of abnormality detection using sound information, it can be recognized that the relevant portion may break down in the future, which can contribute to prevention and prediction.

(Supplementary Note 16) Definition of Display (Sound Information)

With respect to the apparatus of Supplementary Note 14, when the sound information analyzed by the analyzer is an abnormal value, the control part may display an abnormal state of the transfer robot or the pipe on a display.

In the substrate processing apparatus recited in Supplementary Note 16, when an abnormality occurs in the comparison of the waveform data of the sound information, a message indicating the abnormality of the portion is displayed on the display. In addition, the relevant portion may be included in the message from the event information at the time of abnormality detection.

In the substrate processing apparatus recited in Supplementary Note 16, the operator is made to recognize the abnormality by displaying a message when the abnormality is detected.

In the case of abnormality detection using sound information, it can be recognized that the relevant portion may break down in the future, which can contribute to prevention and prediction.

(Supplementary Note 17) Definition of Memory

With respect to the apparatus of Supplementary Note 14, the control part may access a memory configured to store a history of the sound information or the vibration information received by the sound information receiver or the vibration information receiver; and the analyzer may be configured to compare the sound information or the vibration information with the history stored in the memory to determine an abnormality.

In the substrate processing apparatus recited in Supplementary Note 17, the vibration information and the sound information are stored in the memory for each event information. The collection period of the vibration information and the sound information is from the start to the stop of the event.

In the substrate processing apparatus recited in Supplementary Note 17, since the start time of the waveform data is made clear for collecting information at the start/end timing of each event, the waveform data can be easily compared.

(Supplementary Note 18) Update of Vibration Information or Sound Information

The apparatus of Supplementary Note 17, wherein the memory may be configured to receive a comparison result from the analyzer and store sound information or vibration information of the history when the comparison result is determined to be normal.

In the substrate processing apparatus recited in Supplementary Note 18, the analyzer compares the waveform with the vibration information or the sound information saved in the memory. If it is normal, the target information is overwritten and stored as history data in the area of the memory designated for each event information. If it is necessary to check the past history, it may be saved separately from the existing data instead of overwriting and saving.

In the substrate processing apparatus recited in Supplementary Note 18, the latest waveform data of vibration information or sound information is always stored in the memory by overwriting and saving, which makes it easy to compare the waveforms.

If the waveform data of vibration information or sound information is saved separately instead of being overwritten, the waveform data is stored as history information. Therefore, by superimposing the stored past waveform data, it is possible to calculate the difference in data per unit time. By calculating a correction value for correcting the threshold value from the difference in the data thus obtained and feeding back the calculated correction value to the threshold value, it is possible to perform more accurate abnormality determination.

(Supplementary Note 19) Method of Manufacturing Semiconductor Processing Apparatus A method of manufacturing a semiconductor processing apparatus may include a transfer process of transferring a substrate by a transfer robot; a process of maintaining an atmospheric state or a vacuum state of a transfer chamber accommodating the transfer robot; a process of processing the substrate; a vibration information receiving process of receiving, by a vibration information receiver, vibration information for the transfer robot; a sound information receiving process of receiving, by a sound information receiver, sound information for the transfer robot; and a process of performing, by a control part, at least one of notification of an abnormality of an apparatus and stop of an operation when an abnormality is determined as a result of analysis of the information received from the vibration information receiver or the sound information receiver.

(Supplementary Note 20) Method of Manufacturing Semiconductor Processing Apparatus A method of manufacturing a semiconductor processing apparatus may include transferring a substrate by a transfer robot; maintaining an atmospheric state or a vacuum state of a transfer chamber accommodating the transfer robot; processing the substrate; receiving, by a vibration information receiver, vibration information for the transfer robot; receiving, by a sound information receiver, sound information for the transfer robot; and analyzing the information received from the vibration information receiver or the sound information receiver.

(Supplementary Note 21) Program for Causing Computer of Substrate Processing Apparatus to Perform Substrate Processing Method An execution program for a substrate processing apparatus may include: transferring a substrate by a transfer robot; maintaining an atmospheric state or a vacuum state of a transfer chamber accommodating the transfer robot; processing the substrate; receiving, by a vibration information receiver, vibration information for the transfer robot; receiving, by a sound information receiver, sound information for the transfer robot; and performing, by a control part, at least one of notification of an abnormality of an apparatus and stop of an operation when an abnormality is determined as a result of analysis of information received from the vibration information receiver or the sound information receiver.

According to the program recited in Supplementary Note 21, the computer of the substrate processing apparatus can be caused to perform various controls so as to notify the abnormality of the apparatus or stop the operation of the apparatus.

(Supplementary Note 22)

A substrate processing method may include: an abnormality determination process of comparing operation-sound waveform data acquired from a transfer device for transferring a substrate with normal-sound waveform data when the transfer device is operating normally, determining whether the operation-sound waveform data falls within a threshold value range centered on the normal-sound waveform data, and determining whether the transfer device is normal or abnormal; and a failure determination process of comparing operation vibration data acquired from a transfer device with normal vibration data when the transfer device is operating normally, determining whether the operation vibration data falls within a threshold value range centered on the normal vibration data, and determining whether the transfer device is in failure.

In the substrate processing method recited in Supplementary Note 22, the abnormality of the device can be detected by determining in the abnormality detection process whether the operation-sound waveform data of the transfer device for transferring the substrate falls within a threshold value range centered on the normal-sound waveform data.

Further, the failure of the device can be detected by determining in the failure detection process whether the operation vibration data of the transfer device for transferring the substrate falls within a threshold value range centered on the normal vibration data.

According to the present disclosure in some embodiments, it is possible to detect an abnormality or a failure of a transfer device for transferring a substrate.

While certain embodiments have been described, these embodiments have been presented by way of example only and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a process chamber configured to be capable of processing a substrate;
   a first transfer chamber configured to be capable of accommodating a first transfer that includes a gas-filled container filled with a gas and is configured to be capable of transporting the substrate to the process chamber in a vacuum;
   a sound information receiver configured to be capable of receiving sound information detected by a first microphone installed inside the gas-filled container; and
   an abnormality detector configured to be capable of detecting an abnormality of the first transfer by comparing the sound information with a preset threshold value.

2. The substrate processing apparatus of claim 1, further comprising:
   a vibration information receiver configured to be capable of receiving vibration information generated from the first transfer; and
   a failure detector configured to be capable of detecting a failure of the first transfer by comparing the vibration information with a preset threshold value.

3. The substrate processing apparatus of claim 2, wherein a first sensor configured to be capable of detecting vibration is installed in a mover of the first transfer, and
   wherein the vibration information receiver is configured to be capable of receiving the vibration information detected by the first sensor.

4. The substrate processing apparatus of claim 2, further comprising:
   a second transfer configured to be capable of transporting the substrate; and
   a second transfer chamber configured to be capable of accommodating the second transfer,
   wherein the second transfer chamber is an atmospheric transfer chamber, and
   wherein the second transfer capable of operating in an atmosphere is arranged in the atmospheric transfer chamber.

5. The substrate processing apparatus of claim 4, wherein the second transfer is installed with a second microphone configured to be capable of collecting sound information,
   wherein the second microphone is arranged around the second transfer to receive a sound of a mover of the second transfer, and
   wherein the sound information receiver is configured to be capable of receiving the sound information collected by the second microphone.

6. The substrate processing apparatus of claim 4, wherein the second transfer is installed with a second sensor configured to be capable of detecting vibration,
   wherein the second sensor is configured to be capable of detecting vibration of a mover of the second transfer, and
   wherein the vibration information receiver is configured to be capable of receiving the vibration information detected by the second sensor configured to be capable of detecting the vibration.

7. The substrate processing apparatus of claim 2, further comprising a pipe through which a fluid flows,
   wherein the sound information receiver is configured to be capable of receiving sound information of the pipe; and
   wherein the vibration information receiver is configured to be capable of receiving vibration information of the pipe.

8. The substrate processing apparatus of claim 7, wherein the fluid includes one selected from the group of cooling water, a processing gas, and a purge gas.

9. The substrate processing apparatus of claim 7, wherein the pipe is connected to a flow meter, a valve, or a joint including a flange and is configured to be capable of allowing the fluid to flow therethrough.

10. The substrate processing apparatus of claim 9, wherein a third microphone is configured to be capable of collecting the sound information of the pipe is arranged around the joint or a bending that affects a flow of the fluid.

11. The substrate processing apparatus of claim 7, wherein a third sensor configured to be capable of detecting vibration of the pipe is arranged around a flow meter, a valve, a joint including a flange, or a bending that affects a flow of the fluid.

12. The substrate processing apparatus of claim 7, further comprising an analyzer configured to be capable of analyzing the vibration information received by the vibration information receiver and the sound information received by the sound information receiver.

13. The substrate processing apparatus of claim 12, further comprising a controller configured to be capable of controlling the substrate processing apparatus,
   wherein when the sound information analyzed by the analyzer is an abnormal value, the controller is configured to be capable of controlling to display an abnormal state of the first transfer or the pipe on a display.

14. The substrate processing apparatus of claim 12, further comprising a controller configured to be capable of controlling the substrate processing apparatus,
   wherein when the vibration information analyzed by the analyzer is an abnormal value, the controller is configured to be capable of controlling to display an abnormal state of the first transfer or the pipe on a display.

15. The substrate processing apparatus of claim 12, further comprising a controller configured to be capable of controlling the substrate processing apparatus,
    wherein the controller includes a memory configured to store a history of the sound information received by the sound information receiver or the vibration information received by the vibration information receiver, and
    wherein the analyzer is configured to compare the sound information or the vibration information with the history stored in the memory to determine the abnormality.

16. The substrate processing apparatus of claim 15, wherein the memory is configured to store the sound information or the vibration information of the history if the memory receives a comparison result from the analyzer and the comparison result is determined to be normal.

\* \* \* \* \*